United States Patent
Hokazono et al.

(10) Patent No.: US 10,148,264 B2
(45) Date of Patent: Dec. 4, 2018

(54) SEMICONDUCTOR DEVICE DRIVE CIRCUIT

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/533,945

(22) PCT Filed: Feb. 16, 2015

(86) PCT No.: PCT/JP2015/054126
§ 371 (c)(1),
(2) Date: Jun. 7, 2017

(87) PCT Pub. No.: WO2016/132431
PCT Pub. Date: Aug. 25, 2016

(65) Prior Publication Data
US 2017/0346483 A1 Nov. 30, 2017

(51) Int. Cl.
*H03K 17/56* (2006.01)
*H03K 17/567* (2006.01)
(Continued)

(52) U.S. Cl.
CPC ....... *H03K 17/567* (2013.01); *H01L 29/7815* (2013.01); *H03K 17/04123* (2013.01);
(Continued)

(58) Field of Classification Search
CPC .. H03K 17/567; H03K 17/687; H03K 17/168; H03K 17/20; H03K 17/691; H03K 3/64; H03K 17/60; H03K 17/66
(Continued)

(56) References Cited

U.S. PATENT DOCUMENTS 7,737,761 B2  6/2010  Ishikawa et al.
2009/0002054 A1*  1/2009  Tsunoda ............. H03K 17/0406
327/374

FOREIGN PATENT DOCUMENTS

JP  H05-308272 A  11/1993
JP  H08-340245 A  12/1996
(Continued)

OTHER PUBLICATIONS

Notification of Transmittal of Translation of the International Preliminary Report on Patentability and Translation of Written Opinion of the International Searching Authority; PCT/JP2015/054126; dated Aug. 31, 2017.
(Continued)

*Primary Examiner* — John Poos
(74) *Attorney, Agent, or Firm* — Studebaker & Brackett PC

(57) ABSTRACT

A semiconductor device drive circuit includes a first drive circuit and a second drive circuit. The first drive circuit generates a control signal for controlling a voltage-controlled switching element. The first drive circuit generates a control signal in synchronization with a voltage signal input to the first drive signal. The first drive circuit has an output current capability corresponding to a magnitude of the voltage signal. The second drive circuit outputs a voltage signal to the first drive circuit. The second drive circuit includes an output adjustment circuit that adjusts the magnitude of the voltage signal.

8 Claims, 7 Drawing Sheets

(51) Int. Cl.
*H03K 17/687* (2006.01)
*H01L 29/78* (2006.01)
*H03K 17/0412* (2006.01)
*H03K 17/0812* (2006.01)
*H03K 17/16* (2006.01)

(52) U.S. Cl.
CPC ..... *H03K 17/08122* (2013.01); *H03K 17/163* (2013.01); *H03K 17/164* (2013.01); *H03K 17/687* (2013.01)

(58) Field of Classification Search
USPC .................. 327/108, 109, 110, 111, 112
See application file for complete search history.

(56) References Cited

FOREIGN PATENT DOCUMENTS

| | | |
|---|---|---|
| JP | 2002-184954 A | 6/2002 |
| JP | 2008-092663 A | 4/2008 |
| JP | 2009-111470 A | 5/2009 |

OTHER PUBLICATIONS

International Search Report issued in PCT/JP2015/054126; dated Apr. 7, 2015.

\* cited by examiner

F I G. 1 A
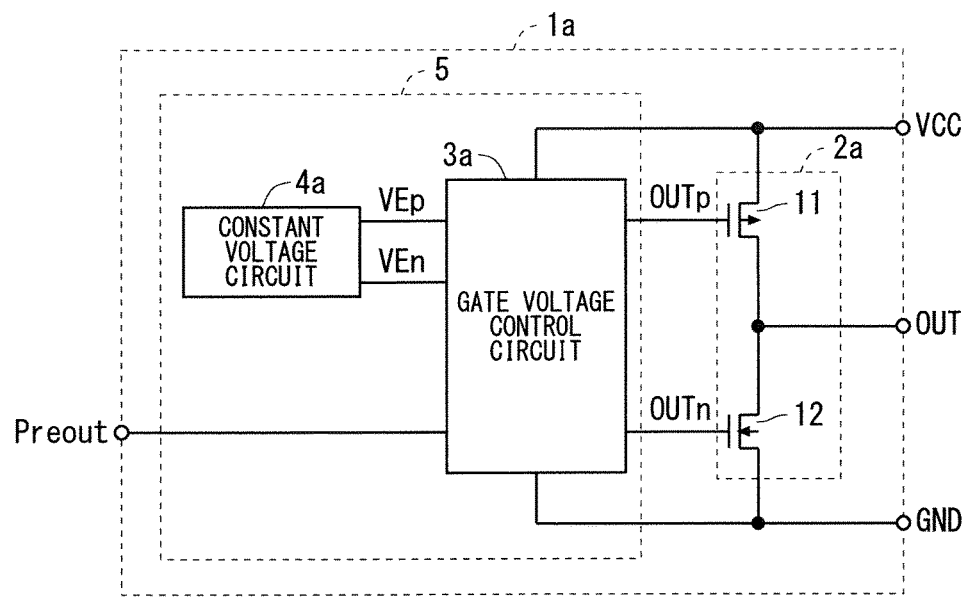
F I G. 1 B
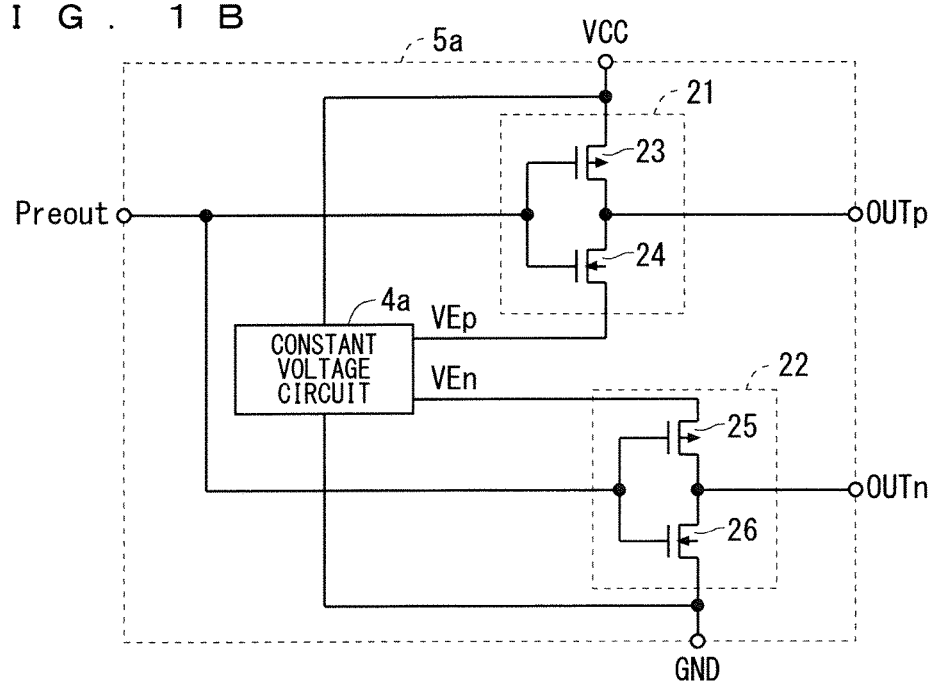

F I G. 2
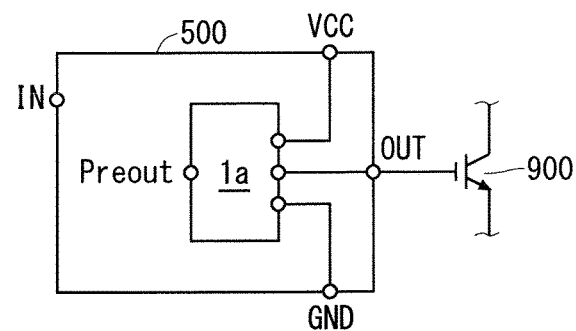
F I G. 3
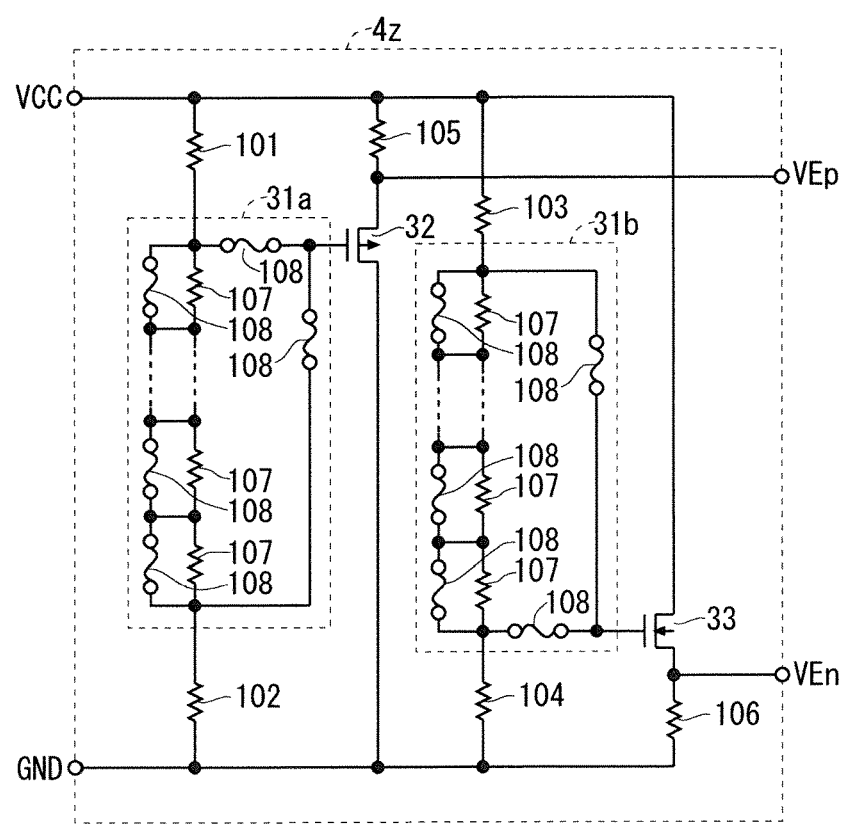

F I G . 5
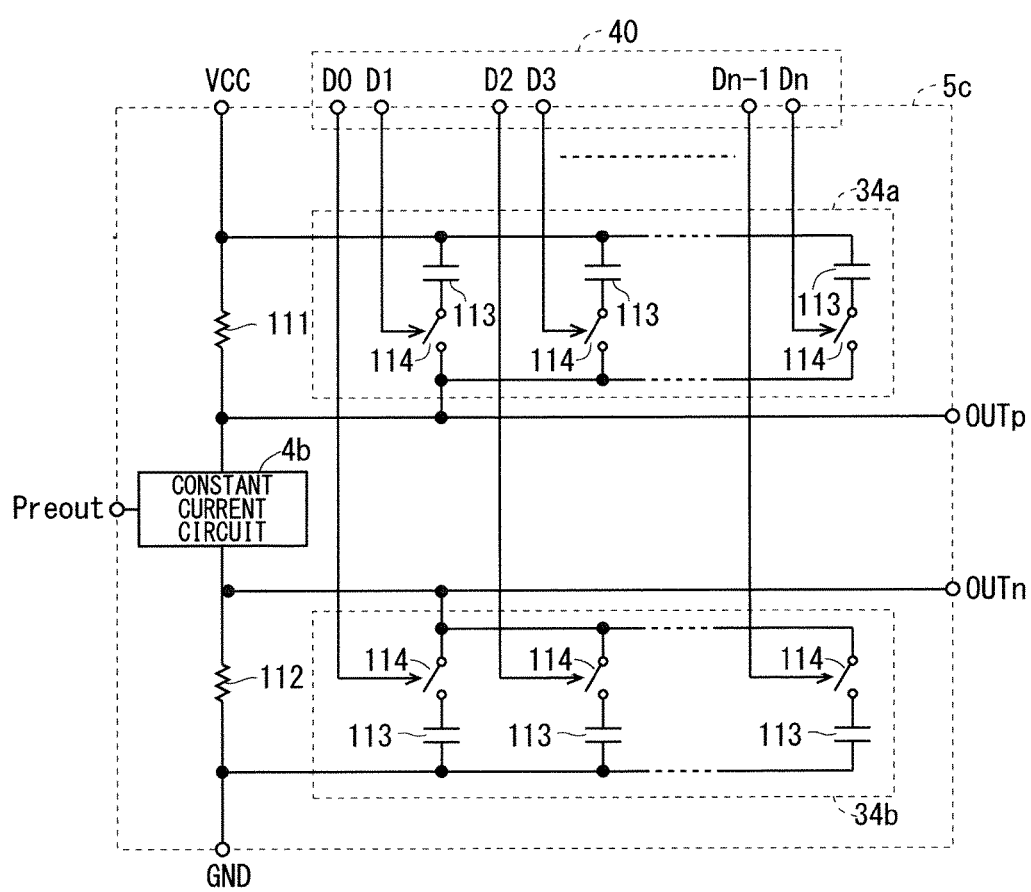

F I G . 6
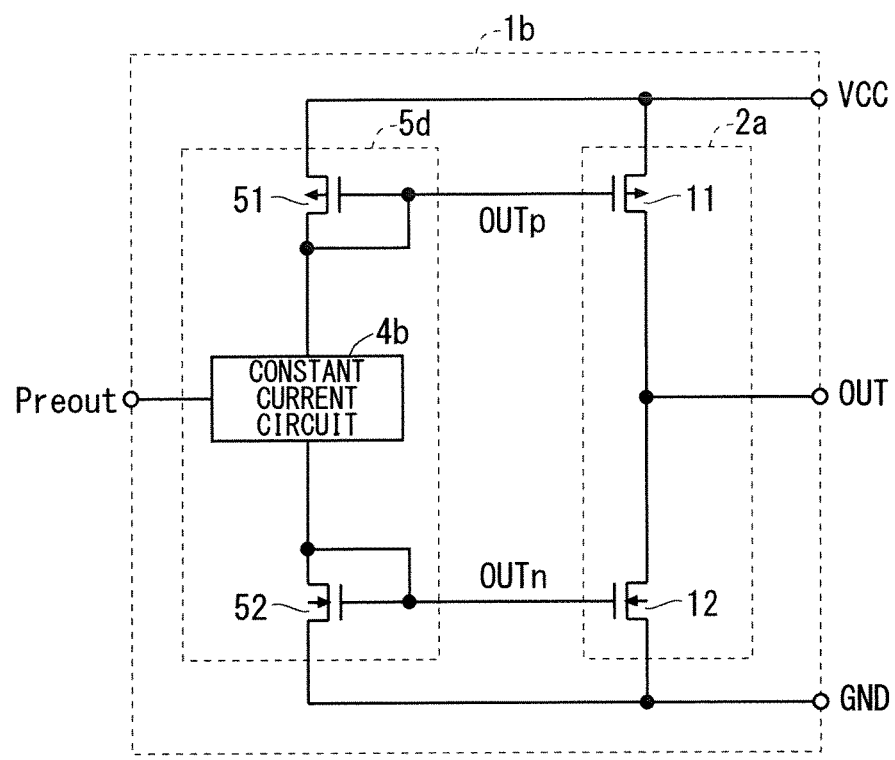

SEMICONDUCTOR DEVICE DRIVE CIRCUIT

TECHNICAL FIELD

The present invention relates to a semiconductor device drive circuit, and more particularly relates to a semiconductor device drive circuit that drives a voltage-controlled switching element.

BACKGROUND ART

The configuration of an output circuit in a semiconductor device drive circuit varies depending on an element or a circuit to be connected downstream of the output circuit. Commonly, such an output circuit connected with a gate-voltage-controlled semiconductor switching element disposed downstream thereof is a circuit that controls the gate voltage by supplying a current to the gate of the semiconductor switching element. The value of the current supplied to the gate is adjusted according to switching characteristics of the semiconductor switching element and is determined for each product category of semiconductor device drive circuits.

The method for determining the current value for each product category differs depending on the circuit configuration of the semiconductor device drive circuit. The output current capability of a circuit from which a transistor outputs a current can be adjusted by adjustments to the size of the transistor. The "output current capability" indicates the maximum value of the current that can be output by the transistor, and more specifically indicates the value of the current which the transistor can supply to the semiconductor switching element when the maximum possible voltage between the source and the drain of the transistor is applied, or typically, when the voltage equivalent to the supply voltage of the semiconductor device drive circuit is applied between the source and the drain.

The size of the transistor is commonly adjusted with consideration given to the general versatility of the semiconductor device drive circuit. Specifically, a plurality of transistors are disposed on the output terminal side in the semiconductor device drive circuit, and the drains of all or some of the transistors are connected to the output terminal through aluminum wires. The number of transistors to be electrically connected to the output terminal can be adjusted by changing the aluminum wire pattern. Thus, the overall transistor size can be adjusted without changing the size of the individual transistor. This configuration can foster the general versatility of the semiconductor device drive circuit. Specifically, unlike the development of tailor-made products in different categories based on different output current capabilities, this method requires a shorter time of work and allows cost reduction. According to this method, however, a mask pattern for each aluminum wire pattern needs to be newly produced at some cost in time and money.

To meet the requirement on reduced output current capability, the overall transistor size associated with the driving of the semiconductor switching element is reduced according to the method above. The area in which a surge voltage input from the output terminal is absorbed decreases with decreasing transistor size, so that an inadequate surge resistance may be provided.

Products having different aluminum wire patterns should fall into different product categories for the inventory control. Allowing commonality of some portions among semiconductor device drive circuits brings about almost no advantage in the inventory control. Problems which arise in the inventory control are as follows.

Semiconductor device drive circuits are normally manufactured in lots. For example, about 25 wafers are used per lot. This means that a relatively large number of products are manufactured in order to meet the immediate demand for a small number of products per category. Consequently, surplus stocks need to be controlled. In the manufacturing of products in ten different categories based on different aluminum wire patterns, the process of producing as many as 250 wafers in total is necessary to meet the immediate demand for a small amount of outgoing shipments.

A method for adjusting the output current capability with no change in the mask pattern is necessary as a workaround to the above-mentioned problems. Disclosed in Japanese Patent Application Laid-Open No. 05-308272 (1993) is a technique for trimming an integrated circuit (IC) drive circuit, which is currently manufactured or has already been manufactured, such that the drive circuit in active use can reach the optimal driving capability. Specifically, fuses are cut off with a laser beam to perform trimming Disclosed in Japanese Patent Application Laid-Open No. 2008-92663 is a technique for controlling the current value at the time of switching by adjustments to the gate resistance based on the detection results on the gate voltage of the semiconductor switching element.

PRIOR ART DOCUMENTS

Patent Documents

Patent Document 1: Japanese Patent Application Laid-Open No. 05-308272 (1993)
Patent Document 2: Japanese Patent Application Laid-Open No. 2008-92663

SUMMARY OF INVENTION

Problems to be Solved by the Invention

The current-carrying capacity of a fuse to be blown out in the laser processing is limited because each fuse usually has a narrow width for easy processing. Such a fuse is used in the above-mentioned technique disclosed in Japanese Patent Application Laid-Open No. 05-308272 (1993), where the magnitude of the gate current in the transistor that drives the power semiconductor switching element is limited accordingly. The above-mentioned transistor is relatively large, and thus, the switching speed of the transistor can be greatly limited when the magnitude of the gate current is limited. The switching speed of the power semiconductor switching element can be greatly limited accordingly. In addition, electromigration may occur due to the current density which is higher in the fuses than in normal wire portions. It may be difficult to perform matching in the transistor operation due to the branched gate wire, using the techniques disclosed in the above-mentioned patent applications laid-open or other general techniques for making changes in the gate wire of the transistor that drives the semiconductor switching element.

As mentioned above, the techniques for changing the wire arrangement in part of the semiconductor device drive circuit that is directly related to the application of signals to the semiconductor switching element adversely affect various characteristics of the semiconductor device drive circuit to a large extent. The above-mentioned technique disclosed in Japanese Patent Application Laid-Open No. 2008-92663 eliminates the need for changing the wire arrangement but requires control based on the detection results on the gate voltage of the semiconductor switching element. Ultimately, the control becomes complicated.

The present invention has been made to solve the problems above and has an object to provide a semiconductor device drive circuit capable of readily adjusting the output current capability without the need for changing the configuration of part of the semiconductor device drive circuit that is directly related to the application of signals to a semiconductor switching element.

Means to Solve the Problems

A semiconductor device drive circuit according to the present invention is for use in driving a voltage-controlled switching element. The semiconductor device drive circuit includes a first drive circuit and a second drive circuit. The first drive circuit generates a control signal for controlling a voltage-controlled switching element. The first drive circuit generates the control signal in synchronization with a voltage signal input to the first drive circuit. The first drive circuit has an output current capability corresponding to a magnitude of the voltage signal. The second drive circuit outputs the voltage signal to the first drive circuit. The second drive circuit includes an output adjustment circuit that adjusts the magnitude of the voltage signal.

Effects of the Invention

In the present invention, the output current capability of the semiconductor device drive circuit that drives the voltage-controlled switching element is adjusted by adjustments to the magnitude of the voltage signal output by the second drive circuit connected to the voltage-controlled switching element via the first drive circuit. Thus, the output current capability can be readily adjusted without the need for changing the configuration of the first drive circuit, which is part of the semiconductor device drive circuit that is directly related to the application of signals to the voltage-controlled switching element.

BRIEF DESCRIPTION OF DRAWINGS

FIG. 1A A diagram schematically illustrating the configuration of an output circuit of a semiconductor device drive circuit according to a first embodiment of the present invention.

FIG. 1B A diagram illustrating a concrete example of a second drive circuit shown in FIG. 1A.

FIG. 2 A diagram illustrating the semiconductor device drive circuit including the output circuit shown in FIG. 1A, together with a voltage-controlled switching element driven by the drive circuit.

FIG. 3 A circuit diagram schematically illustrating the configuration of a constant voltage circuit according to a second embodiment of the present invention.

FIG. 5 A diagram schematically illustrating the configuration of the second drive circuit according to a fourth embodiment of the present invention.

FIG. 6 A diagram schematically illustrating the configuration of the output circuit of the semiconductor device circuit according to a fifth embodiment of the present invention.

DESCRIPTION OF EMBODIMENTS

Figure 4A:
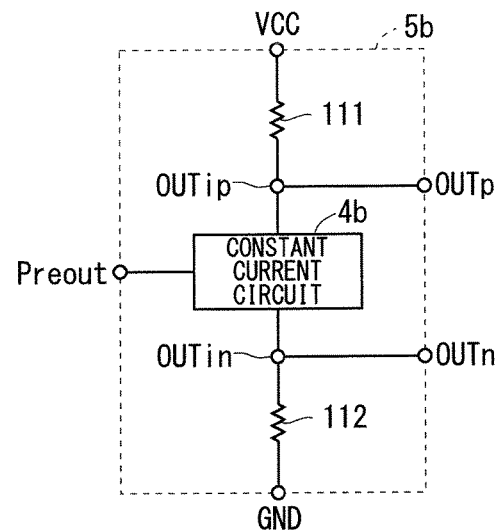
FIG. 4A A diagram schematically illustrating the configuration of the second drive circuit according to a third embodiment of the present invention.

Embodiments of the present invention will be described below with reference to the drawings. The same reference signs in the drawings denote the same or corresponding parts and the description thereof will not be repeated.

First Embodiment

Overview

Firstly, an overview of the present embodiment will be given below. FIG. 1A schematically illustrates the configuration of an output circuit 1a of a semiconductor device drive circuit according to the present embodiment. FIG. 2 illustrates a semiconductor device drive circuit 500 including the output circuit 1a and also illustrates a semiconductor switching element 900 (a voltage-controlled switching element) driven by the drive circuit.

With reference to FIG. 2, the semiconductor device drive circuit 500 includes an input terminal IN and an output terminal OUT. The output circuit 1a is located on the output terminal OUT side of the semiconductor device drive circuit 500. The output circuit 1a outputs, from the output terminal OUT, a control signal synchronized with a signal Preout. Typically, the signal Preout is a binary voltage signal with a high level (H) and a low level (L), and is generated in the semiconductor device drive circuit 500, in synchronization with an external signal from the input terminal IN.

The control signal from the output terminal OUT is input to the gate of the semiconductor switching element 900 as a gate signal. The gate voltage of the semiconductor switching element 900 is controlled accordingly. Consequently, the semiconductor switching element 900 is switched in synchronization with the external signal received by the input terminal IN. The semiconductor switching element 900 is thus driven.

Although the semiconductor switching element 900 shown in FIG. 2 is an insulated-gate bipolar transistor (IGBT), the voltage-controlled semiconductor switching element to be driven is not limited to the IGBT and may be, for example, a metal-insulator-semiconductor field-effect transistor (MISFET) or a junction field-effect transistor (JFET).

With reference to FIG. 1A, the output circuit 1a includes a first drive circuit 2a and a second drive circuit 5. The first drive circuit 2a is driven by the second drive circuit 5 to generate a control signal for controlling the semiconductor switching element 900 (FIG. 2). The generated control single is output from the output terminal OUT.

The first drive circuit 2a includes a P-channel metal oxide semiconductor (PMOS) 11 and an N-channel metal oxide semiconductor (NMOS) 12, each of which is an insulated-gate field-effect transistor. The gate of the PMOS 11 and the gate of the NMOS 12 respectively receive inputs of voltage signals OUTp and OUTn output from the second drive circuit 5. The first drive circuit 2a is configured to switch the control signal output from the output terminal OUT according to the state of the voltage signals OUTp and OUTn. In other words, the first drive circuit 2a generates a control signal to be output to the semiconductor switching element 900 (FIG. 2), in synchronization with the received voltage signals OUTp and OUTn.

The gate electrode of the semiconductor switching element 900 has capacitance (gate capacitance). The semiconductor switching element 900 is a power semiconductor device, which works with a relatively large current, and thus, the capacitance is not negligible. Changing the gate voltage is not instantaneous because of the capacitance, and requires current supplied from the output terminal OUT to the gate electrode of the semiconductor switching element 900 over a period of time corresponding to the output current capability of the first drive circuit 2a. The magnitude of the current above varies according to the magnitude of the voltage signals OUTp and OUTn input from the second drive circuit 5 to the first drive circuit 2a. That is, the output current capability of the first drive circuit 2a is adjusted according to the magnitude of the voltage signals OUTp and OUTn. Specifically, the source current corresponding to the magnitude of the voltage signal OUTp from the second drive circuit 5 and the sink current corresponding to the magnitude of the voltage signal OUTn from the second drive circuit 5 are output as control signals from the output terminal OUT.

The second drive circuit 5 includes a gate voltage control circuit 3a for driving the first drive circuit 2a and a constant voltage circuit 4a (an output adjustment circuit) for supplying the gate voltage control circuit 3a with a constant voltage. The gate voltage control circuit 3a outputs the voltage signals OUTp and OUTn synchronized with the received signal Preout respectively to the gate of the PMOS 11 and the gate of the NMOS 12 in the first drive circuit 2a. Specifically, the voltage signals OUTp and OUTn are output in such a manner the switching between the state in which the PMOS 11 is on and the NMOS 12 is off and the state in which the PMOS 11 is off and the NMOS 12 is on takes place in response to the signal Preout.

The gate voltage control circuit 3a is configured to change the magnitude of the voltage signal OUTp at the turning-on of the PMOS 11 according to the magnitude of a voltage VEp supplied from the constant voltage circuit 4a, and is also configured to change the magnitude of the voltage signal OUTn at the turning-on of the NMOS 12 according to the magnitude of a voltage VEn supplied from the constant voltage circuit 4a.

The constant voltage circuit 4a generates the voltages VEp and VEn with respect to a reference potential GND. Each of the voltages VEp and VEn may be any voltage lower than or equal to a supply voltage VCC. Thus, the potentials corresponding to the voltages VEp and VEn are between the reference potential GND and the potential that corresponds to the supply voltage VCC. The constant voltage circuit 4a is configured in such a manner that the magnitude of at least one of the voltages VEp and VEn is adjustable. The magnitude of the constant voltage is typically adjusted by making a setting before the constant voltage circuit 4a is put to use. The specific configuration of the constant voltage circuit 4a is not limited. For example, the configuration in a second embodiment (FIG. 3), which will be described below, is applicable.

The voltages VEp and VEn generated by the constant voltage circuit 4a correspond respectively to the magnitude of the voltage signal OUTp and the magnitude of the voltage signal OUTn at the turning-on of the PMOS 11 and the NMOS 12. The magnitude of the voltage VEp and the magnitude of the voltage VEn are individually adjusted, and thus, the magnitude of the voltage signal OUTp and the magnitude of the voltage signal OUTn at the turning-on of the PMOS 11 and the NMOS 12 are adjusted accordingly. Consequently, the magnitude of the gate voltage of each of the PMOS 11 and the NMOS 12 in the on state is adjusted. The current in the PMOS 11 and the current in the NMOS 12 are adjusted accordingly. That is, the magnitude of the current generated from the output terminal OUT is adjusted. This means that the output current capability of the first drive circuit 2a is adjusted.

According to the present embodiment, the output current capability of the first drive circuit 2a can be adjusted only by changing the setting of the magnitude of each of the voltages VEp and VEn in the constant voltage circuit 4a, as mentioned above. Thus, the output current capability for driving the semiconductor switching element 900 can be readily adjusted.

The output current capability is adjusted by changing the setting of the constant voltage circuit 4a located in the second drive circuit 5. No change in the circuit configuration of the first drive circuit 2a is required. This can avoid the necessity for changing the configuration of the part directly related to the application of signals to the semiconductor switching element 900.

Detailed Configuration of First Drive Circuit

The detailed configuration of the first drive circuit 2a, part of which has already been described above, will now be described.

The first drive circuit 2a (FIG. 1A) includes the PMOS 11 and the NMOS 12 that are connected in series between the reference potential GND and the supply voltage VCC. The first drive circuit 2a and the second drive circuit 5 are connected to each other in such a manner that the voltage signal OUTp is applied to the gate of the PMOS 11 and that the voltage signal OUTn is applied to the gate of the NMOS 12. The output terminal OUT is connected between the PMOS 11 and the NMOS 12.

The voltage signals OUTp and OUTn are voltages between zero voltage and the supply voltage VCC. When the voltage placed between the gate and the source according to the voltage signal OUTp is set to be greater than the threshold value of the PMOS 11, the PMOS 11 turns on with the output current capability corresponding to the magnitude of the voltage signal OUTp. Similarly, when the voltage placed between the gate and the source according to the voltage signal OUTn is set to be greater than the threshold value of the NMOS 12, the NMOS 12 turns on with the output current capability corresponding to the magnitude of the voltage signal OUTn. In this configuration, currents are output from the output terminal OUT with the output current capabilities corresponding to the voltage signals OUTp and OUTn, which are the gate voltages applied to the PMOS 11 and the NMOS 12, respectively.

In the configuration above, the magnitude of the voltage signal OUTp at the turning-on of the PMOS 11 and the magnitude of the voltage signal OUTn at the turning-on of the NMOS 12 are adjusted, and thus, the output current capability of the PMOS 11 and the output current capability of the NMOS 12 can be adjusted accordingly. In order to double the output current capability output from the NMOS 12, for example, the magnitude of the voltage signal OUTn for turning on the NMOS 12 is multiplied by approximately $2^{1/2}$. The allowable range of the output current capability is determined based only on the sizes of the PMOS 11 and the NMOS 12.

In this configuration, low gate-source voltages can be set for the PMOS 11 and the NMOS 12, which drive the semiconductor switching element 900. This can extend the period of saturated operation achieved by the PMOS 11 and the NMOS 12 at the time of switching. The output current barely varies with respect to changes in the drain-source voltage during the saturated operation of the metal oxide semiconductors, which stabilizes the switching.

Detailed Configuration of Second Drive Circuit

FIG. 1B illustrates a second drive circuit 5a, which is an example of the detailed configuration of the second drive circuit 5 (FIG. 1A). The second drive circuit 5a includes the constant voltage circuit 4a and inverters 21 and 22.

The inverter 21 is a circuit for inputting the voltage signal OUTp to the gate of the PMOS 11 in the first drive circuit 2a (FIG. 1A). Where the signal Preout=L, the inverter 21 sets the gate voltage of the PMOS 11 to the supply voltage VCC, thereby turning off the PMOS 11. Where the signal Preout=H, the inverter 21 sets the gate voltage of the PMOS 11 to the voltage VEp, thereby turning on the PMOS 11. The magnitude of the voltage VEp can be adjusted through the use of the constant voltage circuit 41, and thus, the current that flows at the turning-on of the PMOS 11 can be adjusted accordingly.

The inverter 22 is a circuit for inputting the voltage signal OUTn to the gate of the NMOS 12 in the first drive circuit 2a. Where the signal Preout=H, the inverter 22 sets the gate voltage of the NMOS 12 to zero (sets the gate potential to the reference potential GND), thereby turning off the NMOS 12. Where the signal Preout=L, the inverter 22 sets the gate voltage of the NMOS 12 to the voltage VEn, thereby turning on the NMOS 12. The constant voltage circuit 4a can adjust the magnitude of the voltage VEn, and thus, the current that flows at the turning-on of the NMOS 12 can be adjusted accordingly.

To enable the operation above, the inverter 21 includes a PMOS 23 and an NMOS 24 that are connected in series, and the inverter 22 includes a PMOS 25 and an NMOS 26 that are connected in series. The source of the NMOS 24 receives an input of the voltage VEp from the constant voltage circuit 4a, and the source of the PMOS 25 receives an input of the voltage VEn from the constant voltage circuit 4a. The source of the PMOS 23 receives an input of the supply voltage VCC, and the source of the NMOS 26 receives an input of the reference potential GND.

In the second drive circuit 5a mentioned above, the setting of the constant voltage circuit 4a is changed, and thus, the voltages VEp and VEn, which are respectively source voltages of the inverters 21 and 22, are adjusted accordingly. The voltages VEp and VEn correspond respectively to the gate voltage at the turning-on of the PMOS 11 and the gate voltage at the turning-on of the NMOS 12 in the first drive circuit 2a. At the turning-on of the PMOS 11, the inverter 21 outputs the voltage signal OUTp of magnitude corresponding to the magnitude of the voltage VEp generated by the constant voltage circuit 4a. Similarly, at the turning-on of the NMOS 12, the inverter 22 outputs the voltage signal OUTn of magnitude corresponding to the magnitude of the voltage VEn generated by the constant voltage circuit 4a. The magnitude of the current in the PMOS 11 and the magnitude of the current in the NMOS 12 are adjusted by adjustments to the voltages VEp and VEn, respectively. That is to say, the setting of the constant voltage circuit 4a is changed, and thus, the output current capability of the first drive circuit 2a is adjusted accordingly.

Second Embodiment

In the present embodiment, the following will describe, with reference to FIG. 3, a constant voltage circuit 4z applicable as the constant voltage circuit 4a (FIGS. 1(A) and 1(B)) described in the first embodiment above. The constant voltage circuit 4z includes at least one fuse for setting the magnitude of the constant voltage. The magnitude of the constant voltage can be adjusted by blowing out fuses in a selective manner. The configuration of the constant voltage circuit 4z will be described below in detail.

The constant voltage circuit 4z includes a PMOS 32 and an NMOS 33 (insulated-gate field-effect transistors), resistors 101 to 106, and variable resistor units 31a and 31b.

The PMOS 32 and the NMOS 33 constitute a source follower circuit. Specifically, the drain of the PMOS 32 and the drain of the NMOS 33 are connected to the reference potential GND and the supply voltage VCC, respectively. The source of the PMOS 32 is connected to the supply voltage VCC via the resistor 105. The source of the NMOS 33 is connected to the reference potential GND via the resistor 106. The voltages VEp and VEn, which are constant voltages, are output respectively from the source of the PMOS 32 and the source of the NMOS 33. The voltages VEp and VEn are set by adjustments to the gate voltages of the PMOS 32 and the NMOS 33, respectively. The gate voltages of the PMOS 32 and the NMOS 33 are set by adjustments to the resistance values of the variable resistor units 31a and 31b, respectively.

The resistor 105 connected to the source of the PMOS 32 and the resistor 106 connected to the source of the NMOS 33 are disposed in order to prevent the respective sources from becoming high impedance, and may be omitted if there is no concern over high impedance. The resistor 101 or 102 may be replaced with a constant current source or may be omitted. The same holds true for the resistors 103 and 104.

Each of the variable resistor units 31a and 31b includes at least one resistor 107 and at least one fuse 108. The resistance values of the variable resistor units 31a and 31b can be set by blowing out the fuses 108 in a selective manner, that is, by determining whether or not to blow out the individual fuse 108 in the laser processing. Each of the resistors 101 to 104 may have any resistance value, and each of the resistors 107 of the variable resistor units 31a and 31b may also have any resistance value. The number of the resistors 107 and the number of the fuses 108 are not limited. The gate voltage value of the PMOS 32 and the gate voltage value of the NMOS 33 can be adjusted within a range between zero voltage and the supply voltage VCC in a freely-selected step.

According to the present embodiment, the voltages VEp and VEn can be adjusted by blowing out the fuses 108 of the variable resistor units 31a and 31b in a selective manner, as mentioned above. This eliminates the need for a design change, such as a change in the mask pattern, associated with adjustments to the magnitude of the voltage VEp or VEn. Thus, a shorter time of development work is required and cost reduction is allowed in the production of the semiconductor device drive circuits 500 having different output current capabilities.

The fuses 108 are located in the second drive circuit 5 (FIG. 1A) that works with a relatively small current, instead of being located in the first drive circuit 2a (FIG. 1A) that works with a relatively large current for driving the semiconductor switching element 900 (FIG. 2). Therefore, the current flowing through the individual fuse 108 is relatively small. Thus, the individual fuse is less likely to cause degradation in durability.

Inventory control can be exercised in such a manner that the semiconductor device drive circuits 500 are kept in stock with no change in the magnitude of the voltage VEp and the magnitude of the voltage VEn and that the magnitude of the voltage VEp or VEn is changed prior to shipment. In this case, the semiconductor device drive circuits 500 which will be ultimately used at different output current capabilities are put in one product category in terms of inventory control. This facilitates inventory control.

Third Embodiment

In the present embodiment, the following will describe, with reference to FIG. 4A, a second drive circuit 5*b* that can replace the second drive circuit 5 (FIG. 1A). The second drive circuit 5*b* includes a constant current circuit 4*b* (an output adjustment circuit) and resistors 111 and 112.

The constant current circuit 4*b* includes current output terminals OUTip and OUTin. The constant current circuit 4*b* can cause a constant current of adjustable magnitude to flow from the current output terminal OUTip or OUTin. A choice between the current output terminals OUTip and OUTin with regard to the output of constant current is made in synchronization with the signal Preout. Specifically, where the signal Preout=H, a constant current is output from the current output terminal OUTip. Where the signal Preout=L, a constant current is output from the current output terminal OUTin. The resistors 111 and 112 are thus supplied with the constant current respectively from the current output terminals OUTip and OUTin, in synchronization with the signal Preout.

The current output terminal OUTip is connected to the supply voltage VCC via the resistor 111. The current output terminal OUTin is connected to the reference potential GND via the resistor 112. The individual signals having voltages at the current output terminals OUTip and OUTin are output as the voltage signals OUTp and OUTn, respectively. The magnitude of the voltage signal OUTp and the magnitude of the voltage signal OUTn are arbitrarily determined based on both the value of the current supplied from the constant current circuit 4*b* and the resistance values of the resistors 111 and 112.

Figure 4B:
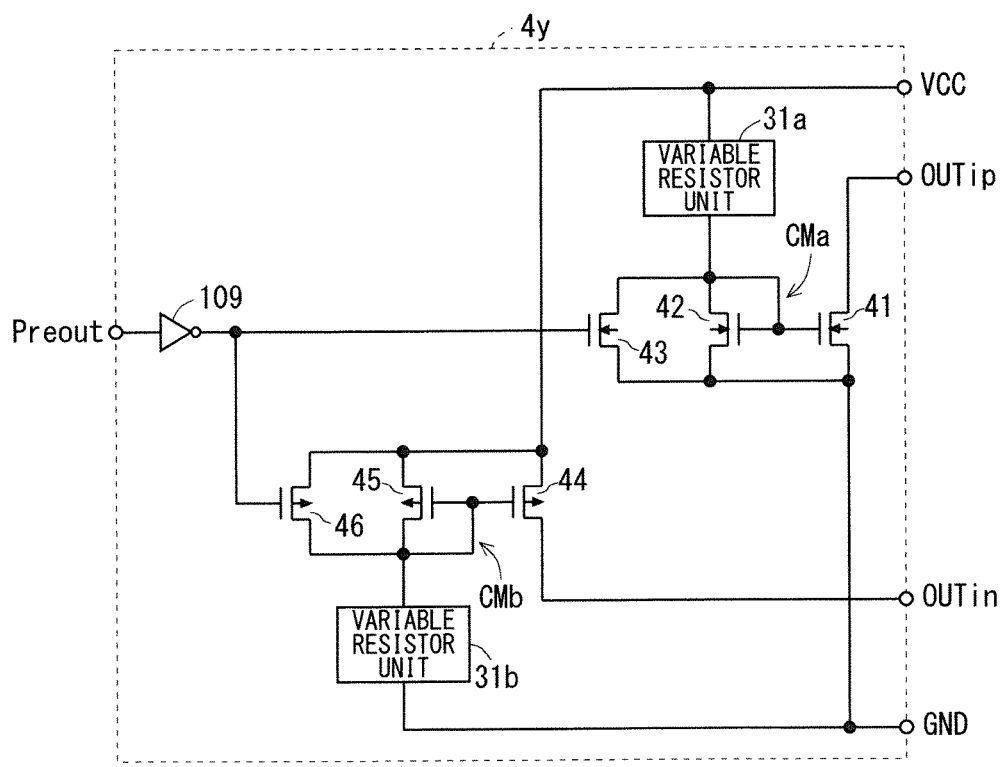
FIG. 4B A diagram illustrating a concrete example of a constant current circuit shown in FIG. 4A.

FIG. 4B illustrates a constant current circuit 4*y*, which is an example of the detailed configuration of the constant current circuit 4*b* (FIG. 4A). The constant current circuit 4*y* includes current mirror circuits CMa and CMb and the variable resistor units 31*a* and 31*b*. The current mirror circuit CMa includes an NMOS 41 and an NMOS 42, and the current mirror circuit CMb includes a PMOS 44 and a PMOS 45. The NMOS 42 and the PMOS 45 are disposed on the reference current side of the current mirror circuit CMa and the reference current side of the current mirror circuit CMb, respectively. The reference current in the current mirror circuit CMa and the reference current in the current mirror circuit CMb are generated in the variable resistor unit 31*a* and the variable resistor unit 31*b*, respectively. The specific configuration of the variable resistor units 31*a* and 31*b* is, for example, as shown in FIG. 3.

The NMOS 42 is connected in parallel with an NMOS 43 and the PMOS 45 is connected in parallel with a PMOS 46. The signal Preout is input to both the gate of the NMOS 43 and the gate of the PMOS 46 via an inverter 109. The current in each of the NMOS 42 and the PMOS 45 flows or ceases in synchronization with the signal Preout. Accordingly, the current supplied from the current output terminal OUTip through the NMOS 41 to the resistor 111 and the current supplied from the current output terminal OUTin through the PMOS 44 to the resistor 112 flow or cease in synchronization with the signal Preout. For example, where the signal Preout=H, the PMOS 46 turns on, and thus, the PMOS 45 is supplied with no reference current. Consequently, the current mirror circuit CMb does not go into action does not operate, so that no current is output from the current output terminal OUTin. Meanwhile, the NMOS 43 turns off, so that the NMOS 42 is supplied with the reference current. Consequently, the current mirror circuit CMa goes into action, so that a current is output from the current output terminal OUTip.

In the present embodiment, the magnitude of the constant current output from each of the current output terminals OUTip and OUTin of the constant current circuit 4*y* is adjusted by adjustments to the corresponding one of the variable resistor units 31*a* and 31*b*. Thus, the value of the current supplied to each of the resistors 111 and 112 is adjusted, and the magnitude of each of the voltage signals OUTp and OUTn can be adjusted accordingly. The magnitude of the voltage signal OUTp and the magnitude of the voltage signal OUTn vary linearly with the current value of the resistor 111 and the current value of the resistor 112, respectively. Thus, the magnitude of each of the voltage signals OUTp and OUTn can be readily adjusted by adjustments to the current value as mentioned above.

Each of the current mirror circuits CMa and CMb may be configured in a manner to allow adjustments to the current mirror ratio. The voltage value of each of the voltage signals OUTp and OUTn can be adjusted by adjustments to the current mirror ratio. The configuration allowing adjustments to the current mirror ratio is enabled by a plurality of metal oxide semiconductors connected in parallel with each other in such a manner that the state of the drain-to-drain connection, the source-to-source connection, or the gate-to-gate connection is changeable through the use of, for example, a switch or a fuse.

Fourth Embodiment

With reference to FIG. 5, a second drive circuit 5*c* in the present embodiment has a configuration in which variable capacitors 34*a* and 34*b* (output adjustment circuits) are connected in parallel respectively with the resistors 111 and 112 in the second drive circuit 5*b* (FIG. 4A) in the third embodiment.

Each of the variable capacitors 34*a* and 34*b* includes at least one capacitor 113 and at least one switch 114. The capacitance of each of the variable capacitors 34*a* and 34*b* can be adjusted according to a choice between the turning-on and the turning-off of the individual switch 114. The value of the individual capacitor 113 can be arbitrarily set. The number of the capacitors 113 and the number of the switches 114 are not limited. The capacitance of each of the variable capacitors 34*a* and 34*b* can be adjusted within a range in a freely-selected step.

The individual switch 114 is turned on and off according to digital signals D0 to Dn included in a digital signal group 40. The digital signal group 40 may be generated according to any method, and may be generated based on the contents stored in a memory in the circuit or may be generated in response to an external input.

In the present embodiment, the magnitude of each of the voltage signals OUTp and OUTn in the rising phase can be adjusted by adjustments to the corresponding one of the variable capacitors 34*a* and 34*b*. Thus, the rate of rise of the gate voltage of the PMOS 11 and the rate of rise of the gate voltage of the NMOS 12 in the first drive circuit 2*a* (FIG. 1A) can be readily adjusted. The variations in the current output from the first drive circuit 2*a* at the time of switching can be readily adjusted accordingly.

The individual switch 114 may be replaced with a fuse that can be blown out in the laser processing. However, the permissible current value of such a fuse is relatively small. To work with a large current, an analog switch such as a transmission gate is preferably used as the switch 114.

In the present embodiment, the magnitude of each of the voltage signals OUTp and OUTn in the rising phase can be adjusted by adjustments to the corresponding one of the variable capacitors 34a and 34b, as mentioned above. It is thus not always required that the magnitude of the constant current in the constant current circuit 4b be adjustable. For example, the variable resistor units 31a and 31b in the constant current circuit 4y (FIG. 4B) may be replaced with fixed resistor units. In this case, the constant current circuit does not function as an output adjustment circuit.

Fifth Embodiment

With reference to FIG. 6, an output circuit 1b in the present embodiment includes both the first drive circuit 2a mentioned in the first embodiment (FIG. 1A) and a second drive circuit 5d. The second drive circuit 5d includes the constant current circuit 4b, a PMOS 51, and an NMOS 52. The constant current circuit 4b supplies each of the PMOS 51 and the NMOS 52 with a constant current. Specifically, the constant current circuit 4b can be the constant current circuit 4y (FIG. 4B).

The PMOS 51 and the PMOS 11 constitute a current mirror circuit, and the NMOS 52 and the NMOS 12 constitute another current mirror circuit. In each current mirror circuit, the above-mentioned constant current is the reference current. In other words, the output circuit 1b includes current mirror circuits in which the current flowing through the first drive circuit 2a is regulated by the reference current flowing through the second drive circuit 5d.

In the present embodiment, the first drive circuit 2a and the second drive circuit 5d constitute a current mirror circuit. Thus, when the constant current generated by the constant current circuit 4b in the second drive circuit 5d is adjusted, the current flowing through the first drive circuit 2a can be linearly adjusted with the constant current. In order to double the output current capability of the NMOS 12, for example, the supply of current from the constant current circuit 4b to the NMOS 52 needs to be doubled.

The elements constituting the individual current mirror circuit are not limited to MOSFETs and may be, for example, bipolar transistors.

Sixth Embodiment

Figure 7:
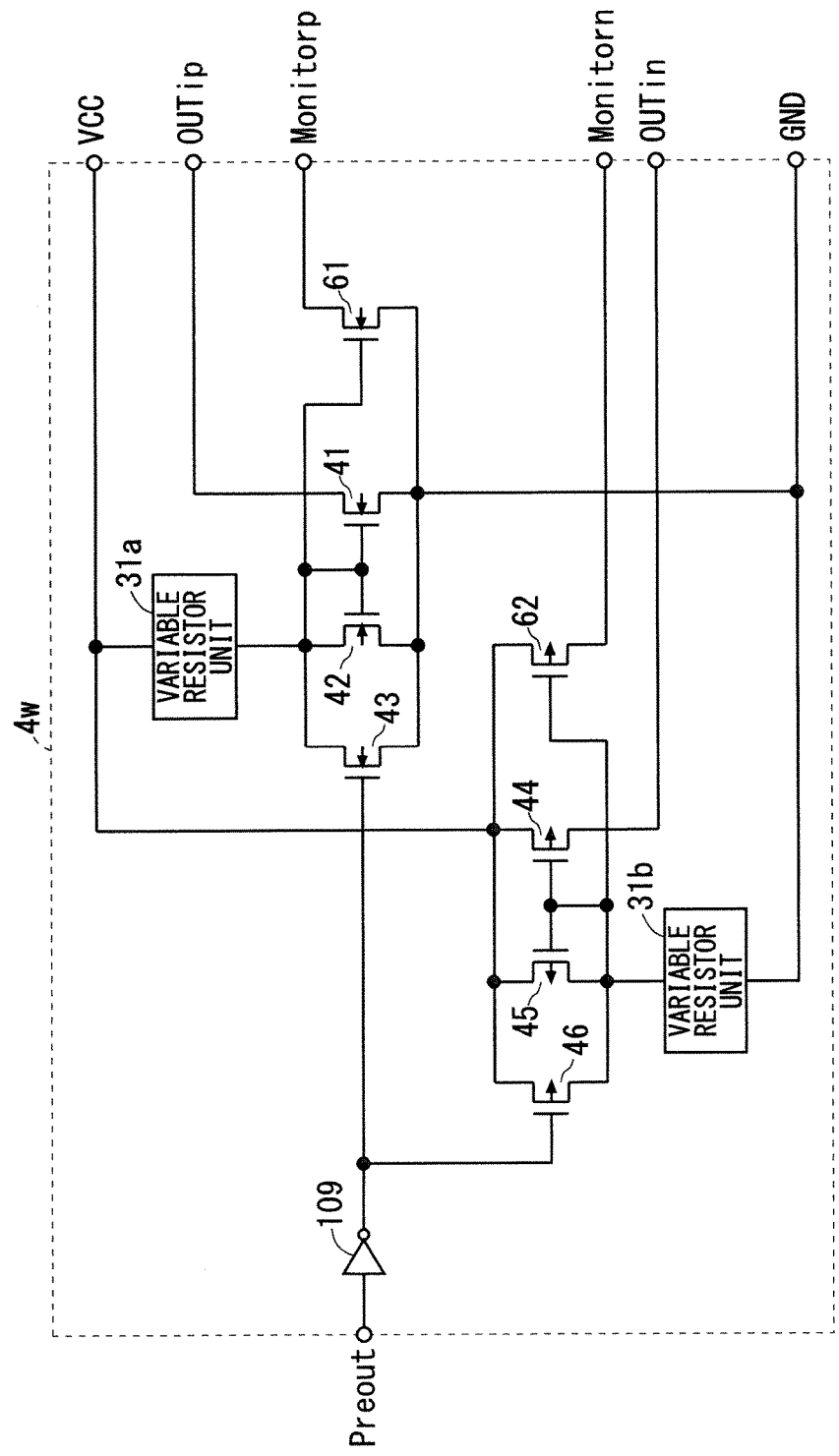
FIG. 7 A diagram schematically illustrating the configuration of the constant current circuit according to a sixth embodiment of the present invention.

With reference to FIG. 7, a constant current circuit 4w in the present embodiment includes, in addition to the configuration of the constant current circuit 4y (FIG. 4B) in the third embodiment, a configuration for monitoring signals in the constant current circuit. Specifically, the constant current circuit 4w includes monitor terminals Monitorp and Monitorn, and also includes an NMOS 61 and a PMOS 62, each of which outputs a current to the corresponding one of the monitor terminals. The NMOS 61 and the NMOS 42 constitute a current mirror circuit, and the PMOS 62 and the PMOS 45 constitute another current mirror circuit. Each of the monitor terminals Monitorp and Monitorn can output, to the outside, a current in accordance with the reference current supplied to the NMOS 42 and the PMOS 45.

In the present embodiment, the monitor terminals Monitorp and Monitorn enable the external monitoring of the reference current in the constant current circuit 4w. The performance of the resistors or the metal oxide semiconductors in the constant current circuit 4w can be evaluated accordingly. Additionally, the output current capability can be adjusted with consideration given to variations in characteristics.

For example, the performance of the variable resistor units 31a and 31b, the performance of the NMOS 42 and the NMOS 61, and the performance of the PMOS 45 and the PMOS 62 can be evaluated based on the currents output from the monitor terminals Monitorp and Monitorn. Additional evaluations may be conducted by comparing the value of the current output from each of the monitor terminals Monitorp and Monitorn with the current output from the output terminal OUT. For example, the difference in the current mirror ratio caused by Early voltage differentials and the performance of the first drive circuit 2a (FIG. 1A) can be evaluated for each of the current mirror circuit including the NMOS 41 and the NMOS 42 and the current mirror circuit including the PMOS 44 and the PMOS 45.

In the present embodiment, the configuration for monitoring signals has been added to the constant current circuit 4y according to the third embodiment, as described above. Alternatively, the similar configuration may be added to another constant current circuit. The configuration for monitoring signals may be added to the constant voltage circuit. For example, a monitor terminal for monitoring the voltage signal may be disposed at the gate of each of the PMOS 32 and the NMOS 33 (FIG. 3) in the second embodiment.

Seventh Embodiment

Figure 8:
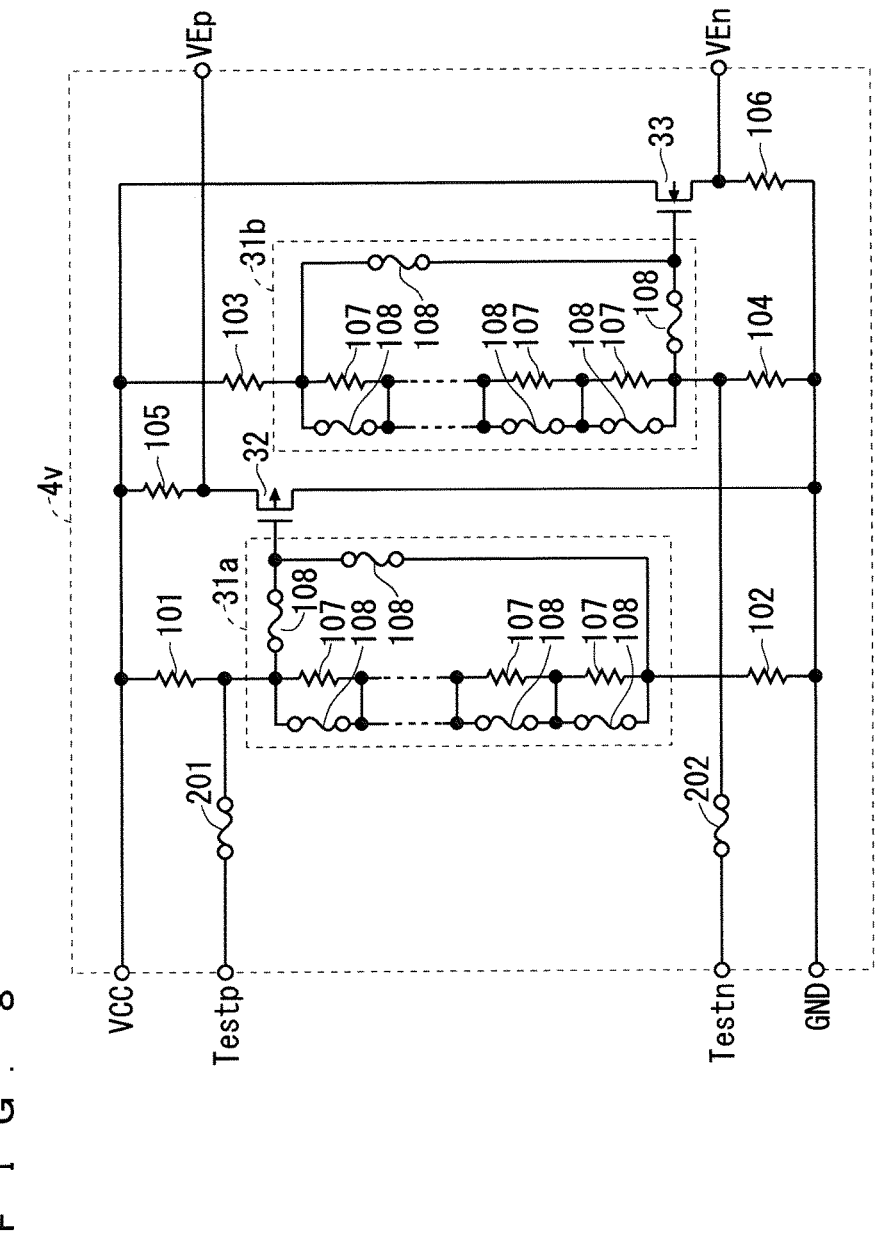
FIG. 8 A diagram schematically illustrating the configuration of the constant voltage circuit according to a seventh embodiment of the present invention.

With reference to FIG. 8, a constant voltage circuit 4v according to the present embodiment includes, in addition to the configuration of the constant voltage circuit 4z (FIG. 3) in the second embodiment, a configuration allowing inputs of signals for conducting tests to the constant voltage circuit. Specifically, the constant voltage circuit 4v includes test terminals Testp and Testn, and also includes fuses 201 and 202. The test terminal Testp is connected to the gate of the PMOS 32 via the fuse 201. The test terminal Testn is connected to the gate of the NMOS 33 via the fuse 202.

The present embodiment allows the external voltage application to the gate of the PMOS 32 through the test terminal Testp. The relationship between the voltage applied to the test terminal Testp and the output current capability from the output terminal OUT (FIG. 1A) can be determined accordingly. The variable resistor unit 31a is adjusted based on the results of the above-mentioned determination, and thus, the output current capability can be adjusted accurately, in the face of relatively large product-to-product variations. The test terminal Testp has been described above, and the test terminal Testn can be used in almost the same way.

The fuses 201 and 202 are cut off after the above-mentioned determination, thereby avoiding surge input to the constant voltage circuit 4v from the test terminals Testp and Testn during active use. When the fuses 108 are cut off in a selective manner in order to adjust the resistance values of the variable resistor units 31a and 31b, the fuses 201 and 202 may be additionally cut off in a collective manner.

In the present embodiment, the configuration for conducting tests has been added to the constant voltage circuit 4z according to the second embodiment as described above. Alternatively, the similar configuration may be added to another constant voltage circuit. The configuration for conducting tests may be disposed in the constant current circuit. For example, a switch for switching back and forth between the first connection target and the second connection target may be disposed at the drain of each of the NMOS 42 and the PMOS 45 (FIG. 4B) in the third embodiment. The variable resistor unit 31*a* is designated as the first connection target of the NMOS 42, and the variable resistor unit 31*b* is designated as the first connection target of the PMOS 45. The test terminal Testp is disposed as the second connection target of the NMOS 42, and the test terminal Testn is disposed as the second connection target of the PMOS 45.

In the present invention, the above embodiments can be arbitrarily combined, or each embodiment can be appropriately varied or omitted within the scope of the invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

IN input terminal
GND reference potential
VCC supply voltage
CMa, CMb current mirror circuit
OUT output terminal
VEn, VEp voltage
OUTn, OUTp voltage signal
OUTin, OUTip current output terminal
Testn, Testp test terminal
Preout signal
Monitorn, Monitorp monitor terminal
1*a*, 1*b* output circuit
2*a* first drive circuit
3*a* gate voltage control circuit
4*a*, 4*v*, 4*z* constant voltage circuit (output adjustment circuit)
4*b*, 4*w*, 4*y* constant current circuit
5, 5*a*, 5*b*, 5*c*, 5*d* second drive circuit
11, 23, 25, 32, 44, 45, 46, 51, 62 PMOS
12, 24, 26, 33, 41, 42, 43, 52, 61 NMOS
21, 22, 109 inverter
31*a*, 31*b* variable resistor unit
34*a*, 34*b* variable capacitor (output adjustment circuit)
40 digital signal group
101 to 107, 111, 112 resistor
108, 201, 202 fuse
114 switch
500 semiconductor device drive circuit
900 semiconductor switching element (voltage-controlled switching element)

The invention claimed is:

1. A semiconductor device drive circuit that drives a voltage-controlled switching element, said semiconductor device drive circuit comprising:
a first drive circuit that generates a control signal for controlling said voltage-controlled switching element, said first drive circuit generating said control signal in synchronization with a voltage signal input to said first drive circuit and having an output current capability corresponding to a magnitude of said voltage signal; and
a second drive circuit that outputs said voltage signal to said first drive circuit, said second drive circuit including an output adjustment circuit that adjusts the magnitude of said voltage signal,
wherein
said first drive circuit includes at least one insulated-gate field-effect transistor having a gate that receives an input of said voltage signal,
said output adjustment circuit includes a constant voltage circuit that generates a constant voltage of adjustable magnitude, and
said second drive circuit includes an inverter that outputs said voltage signal of magnitude corresponding to the magnitude of said constant voltage.

2. The semiconductor device drive circuit according to claim 1,
wherein said constant voltage circuit includes a source follower circuit of an insulated-gate field-effect transistor.

3. A semiconductor device drive circuit that drives a voltage-controlled switching element, said semiconductor device drive circuit comprising:
a first drive circuit that generates a control signal for controlling said voltage-controlled switching element, said first drive circuit generating said control signal in synchronization with a voltage signal input to said first drive circuit and having an output current capability corresponding to a magnitude of said voltage signal; and
a second drive circuit that outputs said voltage signal to said first drive circuit, said second drive circuit including
an output adjustment circuit that adjusts the magnitude of said voltage signal;
a constant current circuit capable of generating a constant current; and
resistors to be supplied with said constant current,
wherein said output adjustment circuit includes an adjustable capacitor that is connected to one of said resistors.

4. The semiconductor device drive circuit according to claim 1,
wherein said inverter includes an inverter output that is coupled to said gate of said at least one insulated-gate field-effect transistor to provide said voltage signal to said gate.

5. The semiconductor device drive circuit according to claim 4,
wherein said inverter includes at least one insulated-gate field-effect transistor configured as the inverter output.

6. The semiconductor device drive circuit according to claim 5,
wherein said at least one insulated-gate field-effect transistor of said inverter receives an input that is received at the second drive circuit to control output of said voltage signal at said inverter output.

7. The semiconductor device drive circuit according to claim 2,
wherein a source of said insulated-gate field-effect transistor of said constant voltage circuit outputs said constant voltage to said inverter.

8. The semiconductor device drive circuit according to claim 3,
wherein said adjustable capacitor includes a plurality of capacitors and switches that are controlled to adjust capacitance of said adjustable capacitor.

* * * * *